(12) United States Patent
Sherazi et al.

(10) Patent No.: US 7,224,910 B2
(45) Date of Patent: May 29, 2007

(54) DIRECT ATTACH OPTICAL RECEIVER MODULE AND METHOD OF TESTING

(75) Inventors: Imran Sherazi, Kanata (CA); Stephen J. Kovacic, Ottawa (CA)

(73) Assignee: Gennum Corporation, Burlington, Ontario (CA)

( * ) Notice: Subject to any disclaimer, the term of this patent is extended or adjusted under 35 U.S.C. 154(b) by 774 days.

(21) Appl. No.: 10/279,719

(22) Filed: Oct. 25, 2002

(65) Prior Publication Data

US 2004/0081473 A1    Apr. 29, 2004

(51) Int. Cl.
*H04B 10/06* (2006.01)

(52) U.S. Cl. .................. 398/207; 398/164; 398/212

(58) Field of Classification Search ........ 398/162–164, 398/207, 212
See application file for complete search history.

(56) References Cited

U.S. PATENT DOCUMENTS

| | | | |
|---|---|---|---|
| 5,198,684 A | | 3/1993 | Sudo |
| 5,252,852 A | | 10/1993 | Makiuchi et al. |
| 5,365,088 A | | 11/1994 | Myrosznyk |
| 5,394,490 A | * | 2/1995 | Kato et al. ..................... 385/14 |
| 5,576,831 A | * | 11/1996 | Nikoonahad et al. ........ 356/623 |
| 6,396,116 B1 | | 5/2002 | Kelly et al. |
| 6,649,994 B2 | * | 11/2003 | Parsons ........................ 257/470 |
| 6,731,122 B2 | * | 5/2004 | Feng ............................ 324/752 |
| 6,859,031 B2 | * | 2/2005 | Pakdaman et al. ........... 324/233 |
| 2002/0135036 A1 | | 9/2002 | Terano et al. |

OTHER PUBLICATIONS

Imler et al., "Precision Flip-Chip Solder Bump Interconnects for Optical Packaging", IEEE ECTC, pp. 508-512, California U.S.A., 1992.
Tan et al., "A High Speed Flip-Chip PIN Photodetector with Integrated Micro-lens", SPIE vol. 2149, pp. 328-335, California U.S.A., 1994.

* cited by examiner

*Primary Examiner*—Dzung Tran
(74) *Attorney, Agent, or Firm*—Freedman & Associates

(57) ABSTRACT

Optical receiver modules are used for receiving high-speed optical data signals. Unfortunately, these optical receiver modules are often tested for the first time after they are packaged in a housing. Thus significant costs are associated with those packaged devices that fail to meet predetermined criteria. An integrated optical receiver module is proposed that has an optical detector direct attached, or flip-chipped or bumped, onto an integrated circuit having an amplifier circuit. The direct attach process is performed when the integrated circuits still reside on a semiconductor wafer prior to dicing thereof. Thus, high speed optical testing of the optical receiver module is possible on a wafer level to determine actual performance characteristics thereof prior to dicing.

38 Claims, 10 Drawing Sheets

DIRECT ATTACH OPTICAL RECEIVER MODULE AND METHOD OF TESTING

FIELD OF THE INVENTION

This invention relates to the area of optical receivers and more specifically in the area of assembly of optical detector modules.

BACKGROUND OF THE INVENTION

Optical receiver modules used for receiving high speed—GHz-optical data signals propagating along an optical fiber are known to those of skill in the art. Typically within these optical receiver modules there is an optical detector electrically coupled to an amplifier circuit in such a manner that light from the optical fiber illuminates the optical detector, the optical detector generates photocurrent in response thereto, and the amplifier circuit amplifies this photocurrent. The optical qualities of the optical detector are typically determined at least in part by the material structure of the optical detector. For some ranges of wavelengths, the materials of choice for the optical detector are costly, and as such, semiconductor materials used for manufacturing the amplifier circuit and the optical detector are typically not the same. Thus, the prior art optical detectors must be electrically wired to the amplifier circuits using wires in order to conduct the photo current.

Typically, the amplifier circuit and the optical detector are purchased from third party vendors prior to assembly. Thereafter, the optical detector, the amplifier circuit, decoupling capacitors, and a module housing are assembled to form an optical receiver. Typically, the housing is designed for easy coupling to an optical fiber. Unfortunately, since these modules are used for receiving high speed optical data, the length of bond wires used to connect the optical detector to the amplifier is critical. These wires exhibit inductance and as such, when photocurrent levels are extremely small in the order or microamperes, variations in intensity of the high speed optical data may not be representative of the actual data transmitted due to the effects of these bond wires. Thus, the module may be more or less sensitive depending on an exact configuration and manufacture.

In manufacturing, manufacturers typically are unable consistently to achieve optimal optical operating characteristics for the assembled receiver modules because the wires coupling the detector to the amplifier circuit play an important role in the performance of the receiver module and are known to vary significantly in manufacture.

Furthermore, isolated testing of the amplifier circuit is not economical or effective without the optical receiver coupled thereto due to the frequency range of operation of the device. Thus, even when optimally assembled, the module may fail to meet desired performance characteristics due to amplifier shortcomings.

Finally, the performance of the module or some subset of the entire assembly will also be dependent upon the value, position, and performance of the power supply decoupling capacitors. These capacitors are often integrated into the module by the manufacturer and contribute to the difficulty of designing a manufacturable module.

As a result a need therefore exists to manufacture the receiver module in such a manner that facilitates testing of the receiver module as a complete system in order to eliminate effects that yield undesirable performance prior to selling thereof. Unfortunately, due to the costly nature of many of the optical receiver semiconductor materials, integration of the module into an integrated circuit format is not considered practicable. For example, different material processing systems commonly rely on wafers having different sizes. Thus, a same wafer mask is not usable with the different processes. This greatly increases the design and manufacture costs for implementing a fully integrated or monolithic photodetector with amplifying circuit.

It is therefore an object of the invention to provide an optical receiver module and method of testing thereof that provides improved performance and performance consistency of the optical receiver module finished product.

SUMMARY OF THE INVENTION

In accordance with the invention there is provided an optical receiver comprising:
  an integrated optical detector for receiving light having a first output port for providing photocurrent in response thereto at the first output port; and,
  an integrated circuit formed of a semiconductor material and having a first input port for receiving the photocurrent and a second input port for receiving a bias voltage and a second output port for providing an output signal, the first input port for direct coupling with the first output port absent a bond wire therebetween, and the integrated optical detector other than formed within the semiconductor material.

In accordance with an aspect of the invention there is provided a method of testing an optical receiver circuit residing on a semiconductor wafer comprising the steps of:
  providing an integrated optical detector directly coupled to an integrated circuit to form the optical receiver circuit, the integrated optical detector other than formed on a same substrate as the integrated circuit;
  illuminating the optical detector with a light source;
  coupling a bias voltage to the integrated circuit; and,
  determining a response of the integrated optical receiver and the integrated circuit to evaluate a performance characteristic thereof.

In accordance with yet another aspect of the invention there is provided an optical receiver comprising:
  an optically opaque housing for substantially enclosing the optical receiver;
  an integrated optical detector for receiving light disposed within the housing and having a first output port for providing photocurrent thereto in response to the received light, the integrated optical detector formed on a first semiconductor substrate; and
  an integrated circuit disposed within the housing and formed of a second semiconductor material in a second semiconductor substrate and having a first input port for receiving the photocurrent and a second input port for receiving a bias voltage and a second output port for providing an output signal, the first input port for coupling with the first output port using a bond wire having predetermined impedance and a predetermined spatial orientation therebetween, the first semiconductor substrate and the second semiconductor substrate being other than the same substrates.

BRIEF DESCRIPTION OF THE DRAWINGS

The invention will now be described with reference to the drawings in which.

DETAILED DESCRIPTION OF THE INVENTION

Figure 1A:
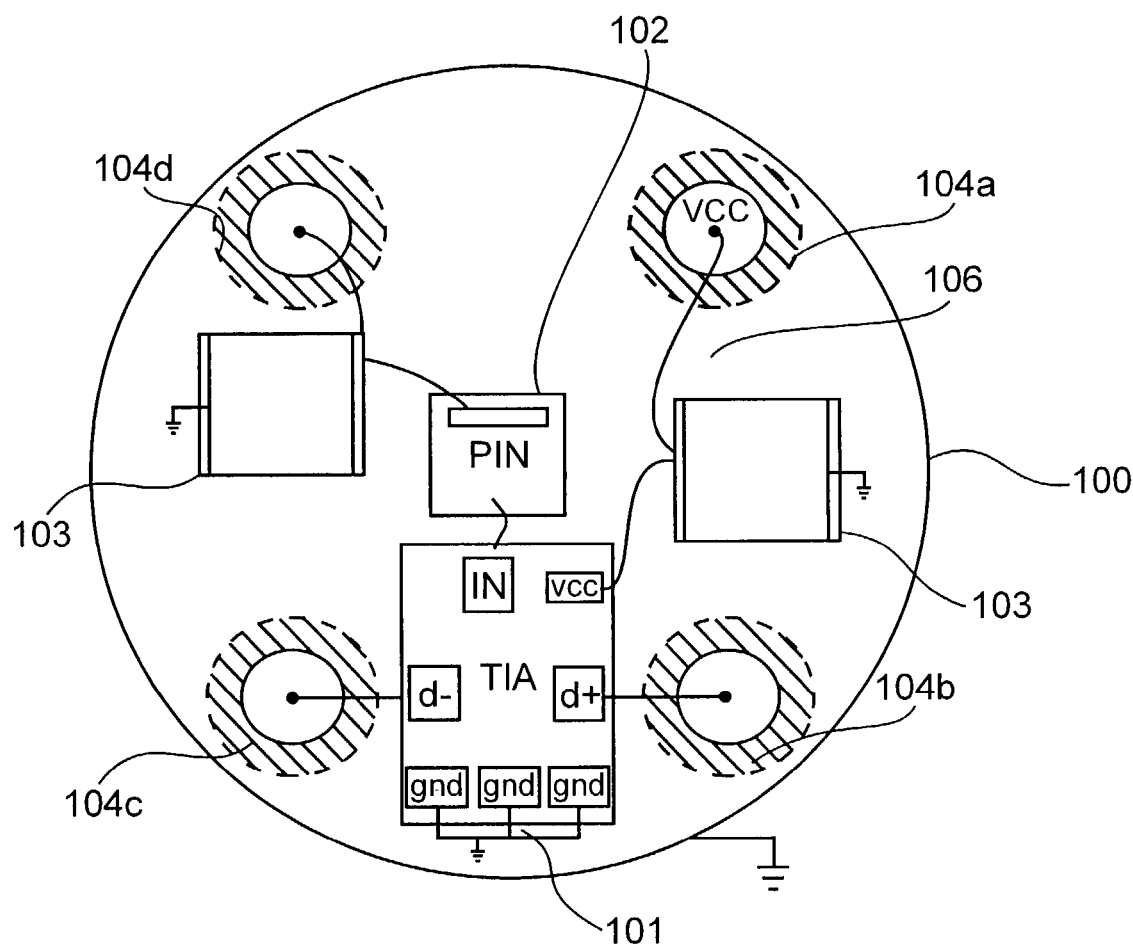
FIG. 1a and FIG. 1b illustrate a prior art optical receiver module.
Figure 1B:
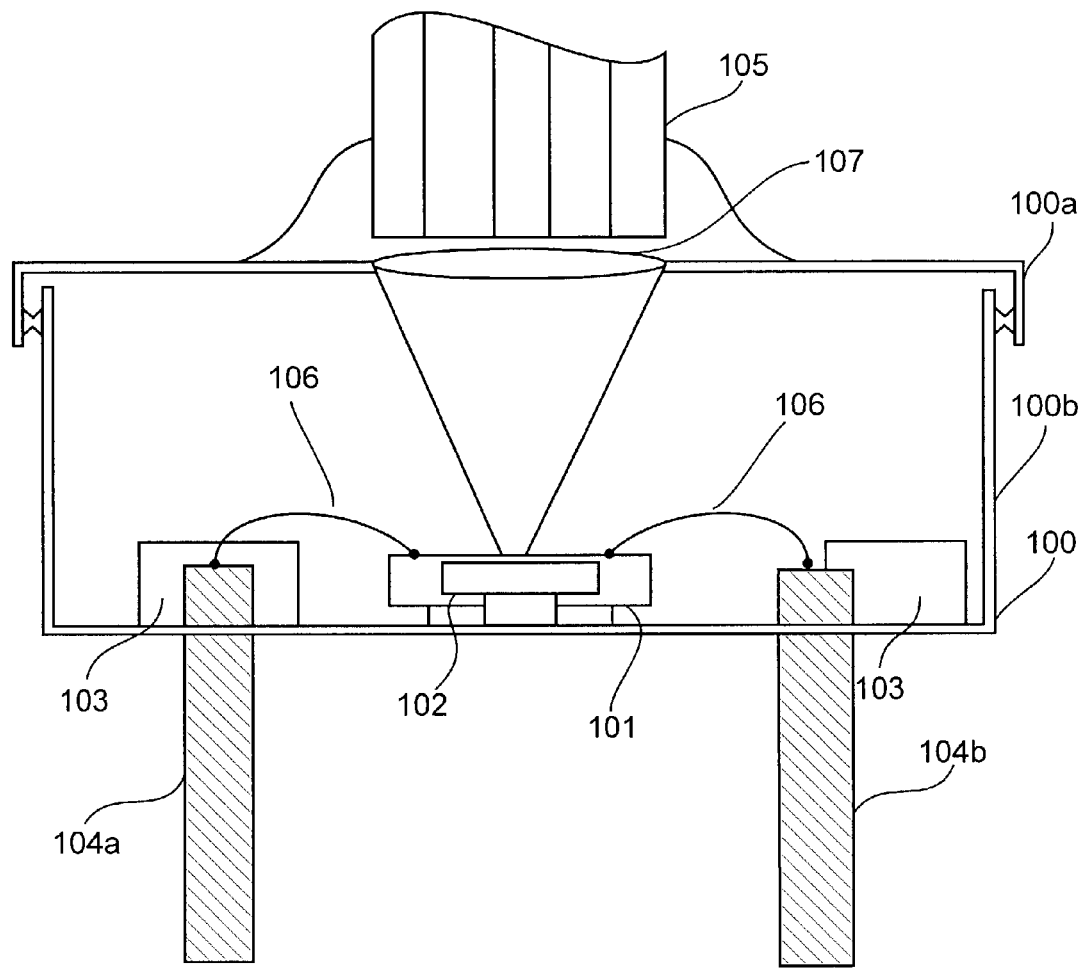

In FIG. 1a and FIG. 1b, a prior art optical receiver module 100 is illustrated. A housing 100a and 100b, consisting of, for example, a TO-46, is used to enclose the optical receiver components, consisting of an integrated transimpedance amplifier circuit (TiA) 101, de-coupling capacitors 103, and an optical detector 102, in the form of a PIN diode. Four header pins 104a through 104d penetrate the housing and at least three of them are electrically insulated therefrom. Bond wires 106 are used within the optical receiver module 100 to electrically connect internal component input and output ports to the four header pins 104a through 104d and to each other. Input ports disposed on the TiA 101 are for receiving a bias voltage and for receiving a photocurrent from the integrated optical detector 102 wire bonded thereto. The de-coupling capacitors 103 are provided to decouple a bias voltage to the TiA and to decouple a bias voltage to the PIN diode 102.

The prior art optical receiver module (as shown in FIG. 1b) is optically coupled to an optical fiber 105 via a lens 107 disposed in an aperture formed in a lid 100a of the housing (100a and 100b). The lens 107 is disposed between an end of the optical fiber 105 proximate the optical receiver module and the optical detector 102. The lens 107 is used to focus light from the optical fiber 105 onto the optical detector 102.

Unfortunately, when these components (103, 101, 102) are placed within the TO-46 package, there is very little space left within the package for positioning of these components (103, 101, 102) as well as additional components. The typical placement of these components (103, 101, 102) used in the prior art involves positioning of the optical detector in a geometric center of the housing 100b, with the TiA 101 positioned between two header pins 104c and 104b, and the de-coupling capacitors 103 placed on either side of the optical detector 102 between header pins 104c and 104d, and 104a and 104b. Not to mention that the placement of these components (103, 101, 102), as well as lengths of bond wires used to form connections therebetween, are critical in terms of optical receiver performance. Especially critical is the bond wire thickness and length between the optical detector 102 and the TiA 101. If these bond wires 106 are too thin or too long, then the effects thereof will adversely affect optical receiver performance. Thus, in order to ensure optimal performance of the optical receiver module, component types (103, 101, 102) as well as the types of bond wires 106 used for internal connections, are critical. Therefore, through careful design and component selection optimal performance may be achieved, however this comes at a cost of having to fully assemble the optical receiver module 100 prior to testing. In other words, an assembly that fails testing, represents a loss of all costs used for assembly thereof.

Unfortunately, the optical receiver modules are not tested until they are fully assembled. This significantly affects optical receiver module manufacturing costs. During manufacturing, multiple TiAs 101 are formed on a semiconductor wafer. Due to manufacturing variances, performance of the TiAs varies across the wafer and in some cases the wafer will have some sections that have undesirable performance. Since only the individual components are tested, it is unknown how the manufactured TiA 101, and optical detector 102 wire bonded thereto, will operate until the device is fully assembled in the housing (100a and 100b). Thus, significant manufacturing costs are incurred because of the unknown performance characteristics of the optical receiver until final packaging.

Figure 2A:
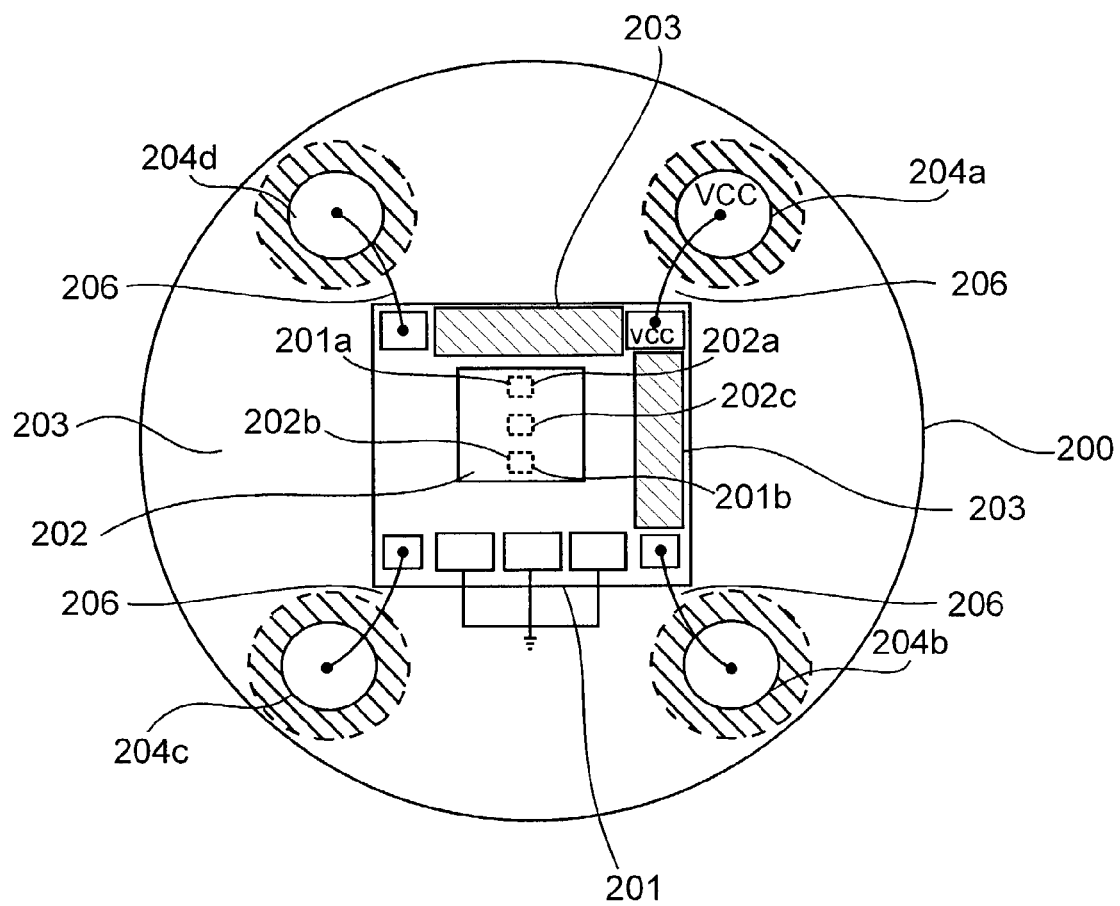
In FIG. 2a and FIG. 2b, an embodiment of the invention is shown, an optical receiver module having an integrated optical detector.
Figure 2B:
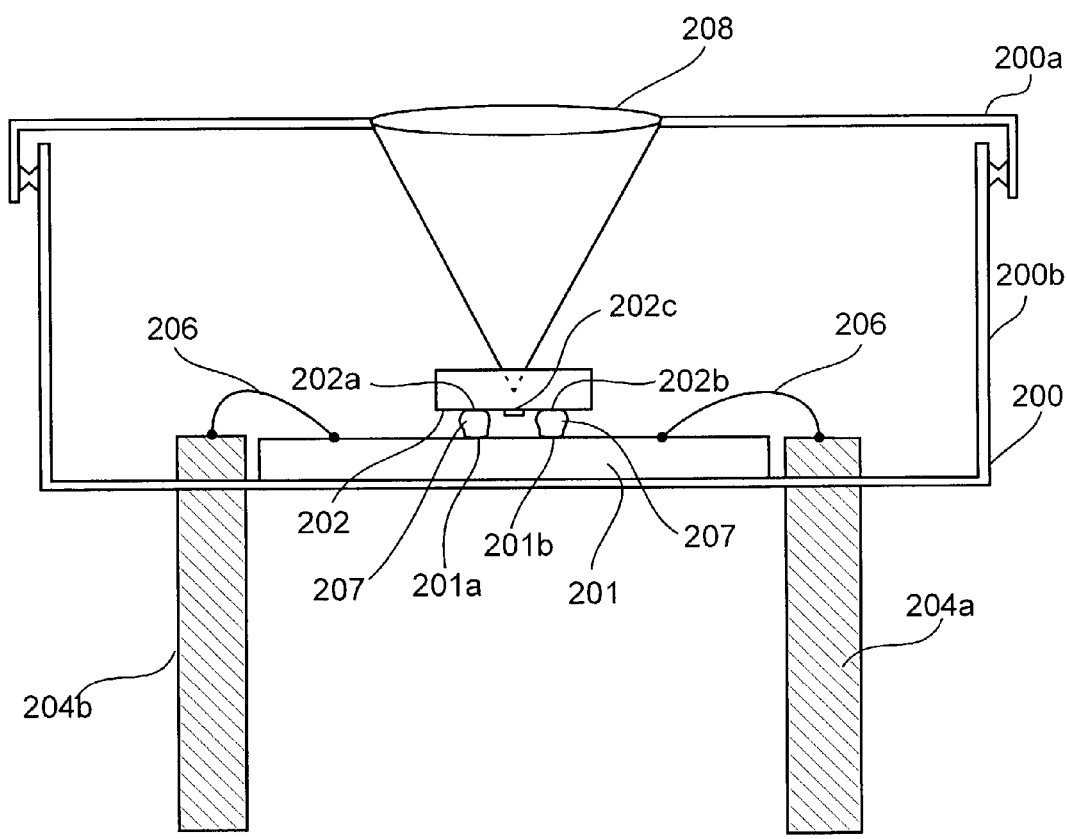
Figure 2C:
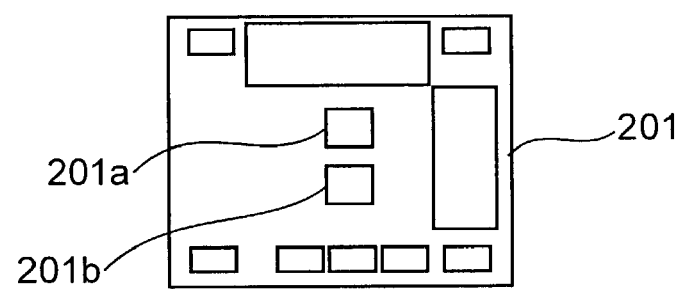
FIG. 2c illustrates an integrated circuit having bonding pads for receiving a flip-chipped optical detector.
Figure 2D:
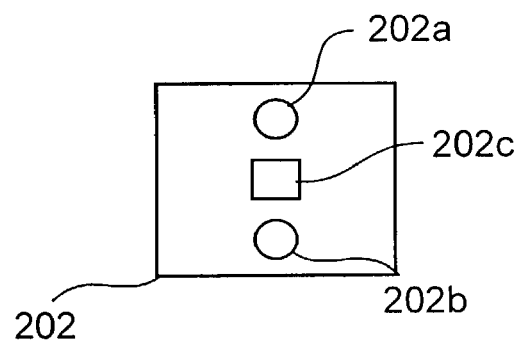
FIG. 2d illustrates the integrated optical detector having a light receiving photosensitive area adjacent two metalized pads.

In FIG. 2a, an embodiment of the invention is shown, an optical receiver module 200 having an integrated optical detector 202, in the form of a PIN diode, having a light receiving photosensitive area 202c adjacent two metalized pads 202a and 202b (FIG. 2d) on a connection side thereof. A housing 200a and 200b as seen in FIG. 2b, such as a TO-46, is used to enclose the optical receiver components, in the form of an integrated circuit 201 with integrated capacitors 203, and the integrated optical detector 202. Four header pins 204a through 204b penetrate the housing and at least three of them are electrically insulated therefrom. Bond wires 206 are used within the optical receiver module 200 to electrically connect the header pins 204a through 204b to the integrated circuit input ports and output port for receiving a bias voltage and for providing an output signal, respectively.

The integrated optical detector 202 is mounted to the integrated circuit 201 using a direct attach technique in the form of "flip-chip," or "bumping." The terms, flip-chip, or bumping, are known to those of skill in the art and their meaning is clarified hereinbelow for the purposes of this specification and the claims that follow. The connection side (FIG. 2d) of the integrated optical detector 202 has two metalized pads 202a and 202b that serve as the anode and cathode. The upper surface of the integrated circuit 201 (FIG. 2c) also has two metalized pads 201a and 201b, in the form of an input port and an output port that have a spacing therebetween similar to that of the integrated optical detector metalized pads 202a and 202b.

The metalized pads on the integrated circuit are first gold plated. Then the integrated optical detector 202 is positioned with the upper surface of the integrated circuit (FIG. 2c) adjacent the integrated optical detector metalized pads 202a and 202b a connection is made therebetween to fix the integrated optical detector 202 onto the integrated circuit 201 using flip-chip, bumping or some form of direct attach technology. For instance, solder 207 is shown in direct attaching of the integrated optical detector 202 to the integrated circuit 201.

Figure 2E:
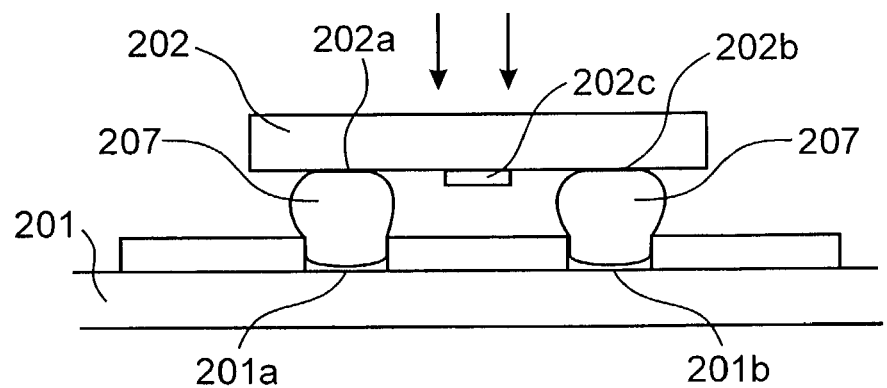
FIG. 2e illustrates back illumination of the integrated optical detector.

Direct attach technology advantageously eliminates bond wires therebetween and ensures the integrated optical detector 202 is in close proximity to the integrated circuit 201 with the integrated optical detector 202 only touching the integrated circuit at preferably two points (as seen in FIG. 2b). Direct attaching of the integrated optical detector 202 onto the integrated circuit 201 advantageously reduces the overall transmission wire length on chip, improves group delay of photocurrent propagating from the integrated optical detector 202 to the integrated circuit 201, and furthermore improves repeatable manufacturability. Clearly, with the connection side of the integrated optical detector 202 having the light receiving photosensitive area 202c facing the integrated circuit substrate, the integrated optical detector 202 is back illuminated (FIG. 2e).

In FIG. 2b, the optical receiver module 200 is shown having an aperture in the housing lid 200a for receiving a lens 208 for focusing received light onto the integrated optical detector 202. Preferably, the integrated circuit 201 contains integrated de-coupling capacitors 203 and an integrated amplifier circuit, in the form of a transimpedance amplifier circuit. Thus, with the flip-chip technique, the integrated circuit 201 and the integrated optical detector 202 are both preferably oriented about the geometric center of the housing 200b in a first orientation (FIG. 2a). Orienting of the integrated optical detector 202 and the integrated circuit 201 in the first orientation in the geometric center of the housing (200a and 200b) advantageously allows a for a larger physical size of die because more room is available within the housing containing the integrated circuit 201 and thus allows for additional circuit functionality to be provided therein or for a reduced housing size. The integrated circuit shown has a substantially rectangular shape, thus in the first orientation the integrated circuit has its four corners in close proximity to the four header pins. Advantageously bonding pads for the input and output ports are provided on the corners of the substantially rectangular shaped integrated circuit, which allows for short bond wires to be used for making electrical connections to each of the header pins (204a through 204d).

Figure 3A:
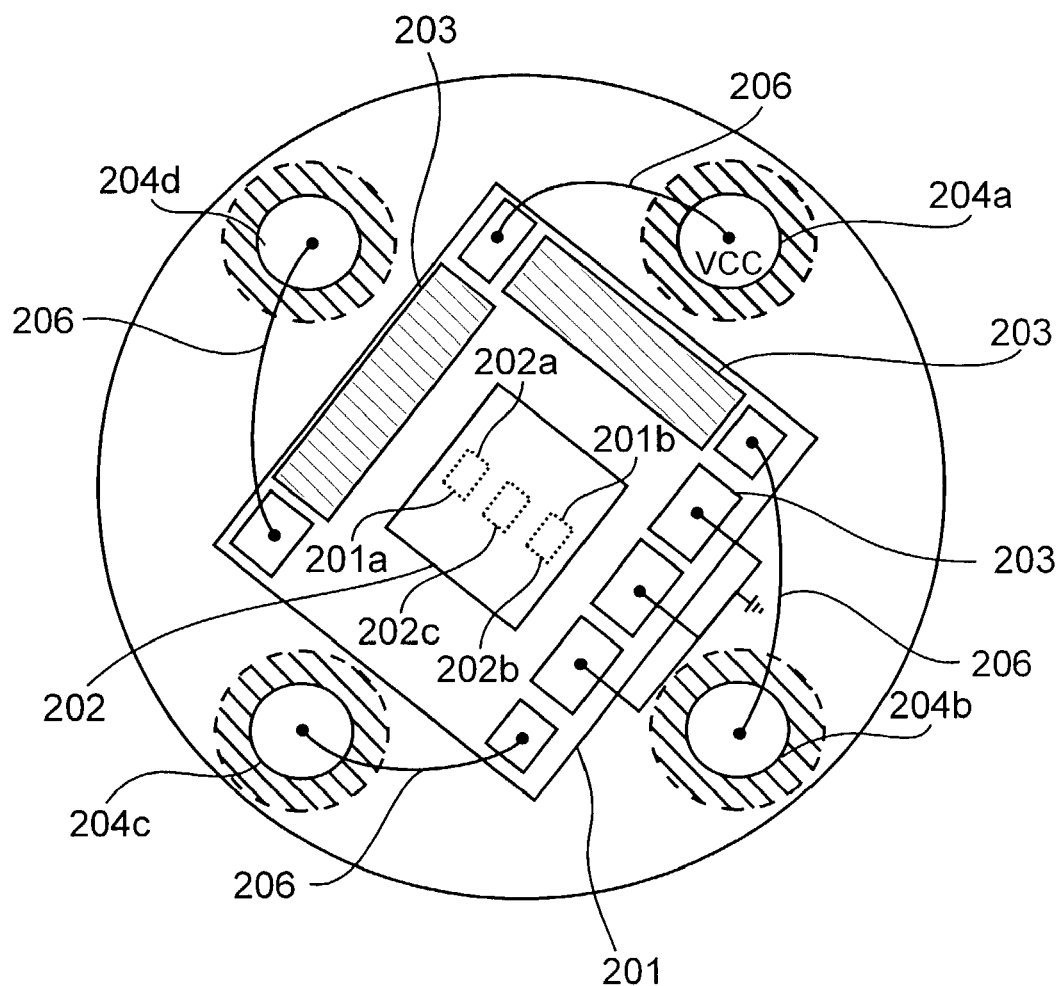
FIG. 3a illustrates a second orientation of the integrated circuit and integrated optical detector direct attached thereon.
Figure 3B:
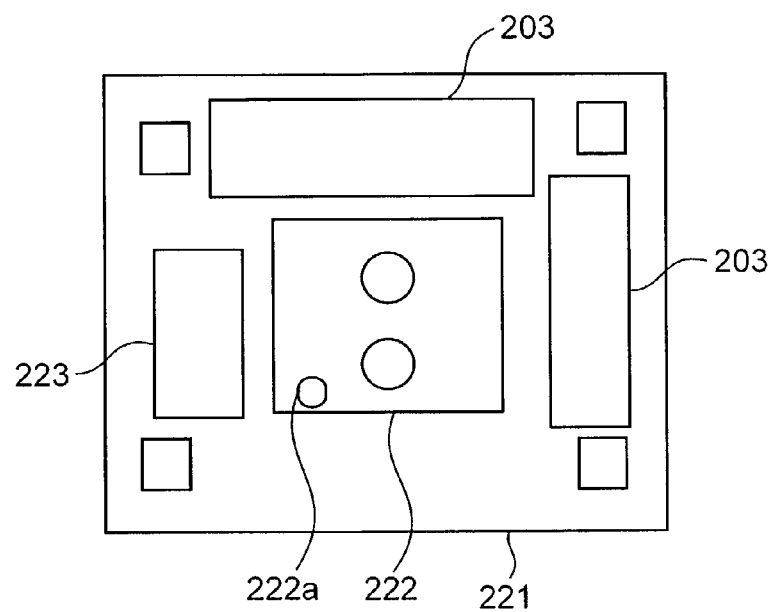
FIG. 3b illustrates an on chip DC—DC converter and integrated avalanche photodiode (APD)

A second orientation of the integrated circuit and integrated optical detector direct attached thereon, for optical receiver module 300, is shown in FIG. 3a. In this case, the substantially rectangular shaped die used for the integrated circuit 201 is oriented with each side of the semiconductor substrate being other than parallel to a line formed between a header pin and a closest adjacent header pin. This second orientation advantageously allows for the physical size of the integrated circuit die to be larger than for the first orientation. Thus, more area is available on the die for adding additional functionality to the integrated circuit, for instance the addition of an on chip DC—DC converter 223 (FIG. 3b). The DC—DC converter 223 is for use with an integrated optical detector in the form of an avalanche photodiode (APD) 222, thus an additional input port 222a is provide on the APD for receiving an amplified bias voltage from an additional output port provided on the integrated circuit 221.

Advantageously, either the first or the second orientations of the integrated circuit and direct attached integrated optical detector allows for a complete 'receiver on a chip' solution that obviates the need for external components. Additionally, vertical stacking of the integrated optical detector and the integrated circuit maximizes space efficiency and allows for a larger die-size that that which was attainable in the prior art. Using a larger die of course decreases the number of devices manufacturable on each wafer, however the benefits that are achieved outweigh the additional costs.

The integrated optical detector is typically fabricated using the most suitable technology in dependence upon a desired wavelength band of operation. Thus, typically for telecommunications purposes the integrated optical detector is manufactured using InP, whereas the integrated circuit is typically manufactured using Si. Thus, direct attaching is highly advantageous since a silicon detector is typically not useable for receiving optical wavelengths used in telecommunications. Of course, to those of skill in the art it would be obvious to eliminate the direct attach process if the integrated detector is manufactured of the same semiconductor material as the integrated circuit. However, this proves problematic due to the limitations imposed within each material process, the costs of the material processes, and the size of the finished integrated circuit.

Figure 4A:
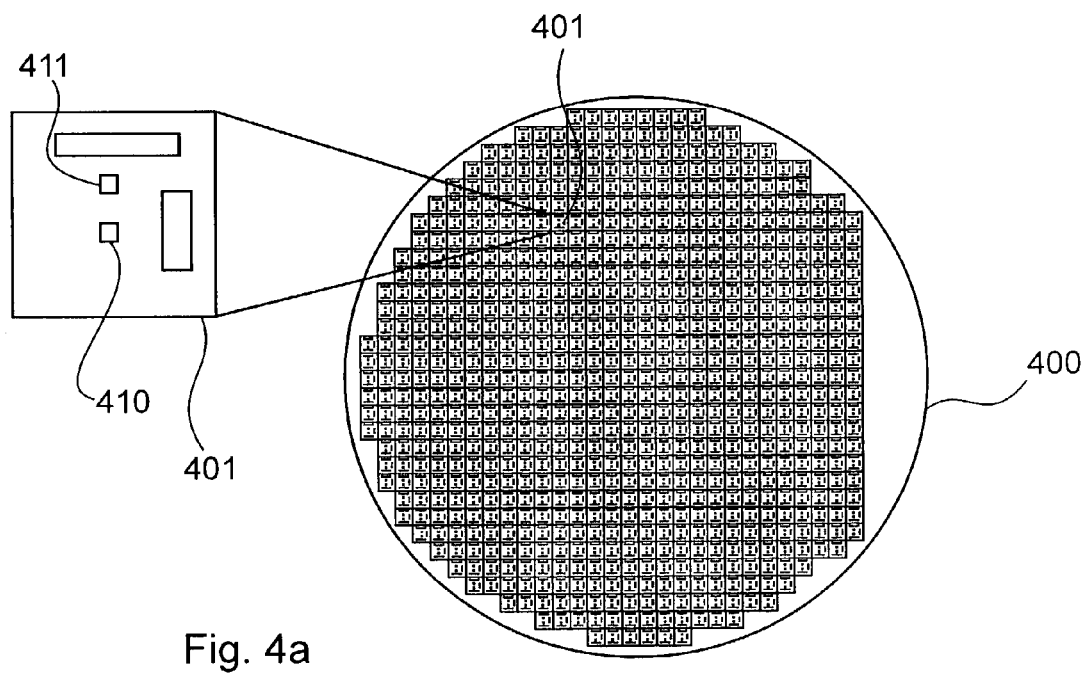
In FIG. 4a, a semiconductor wafer having a plurality of integrated circuits disposed therein, is shown.
Figure 4B:
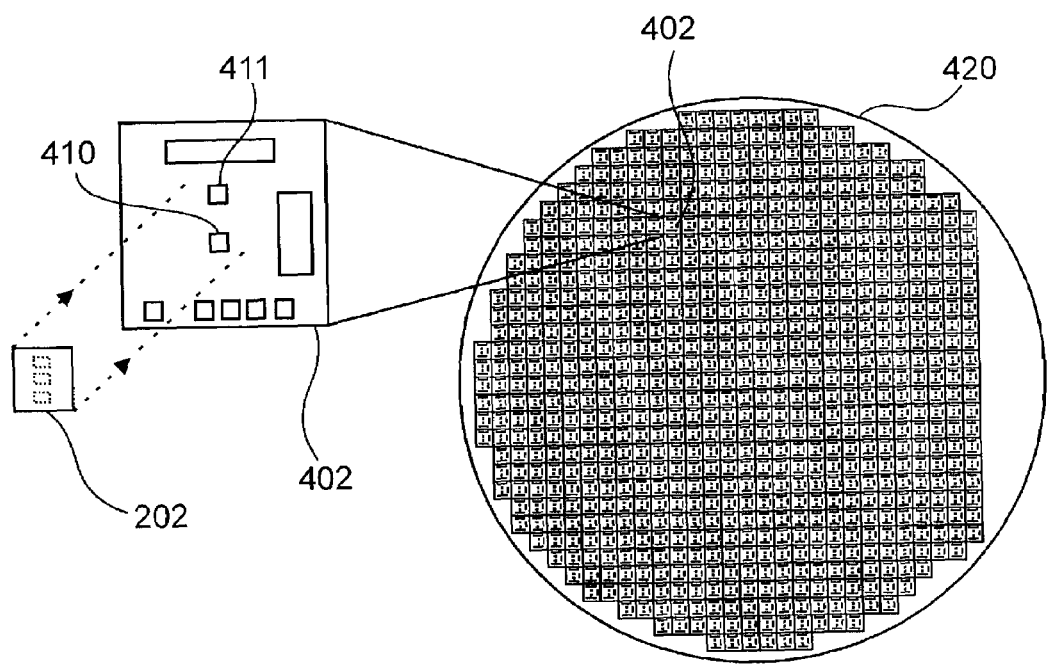
FIG. 4b illustrates a plurality of integrated optical receivers on a chip prior to testing.

In FIG. 4a, a semiconductor wafer 400 having a plurality of integrated circuits 401 disposed therein, is shown. Preferably, the integrated circuits 401 are oriented on the wafer 400 to maximize the number of devices manufacturable on the wafer 400 at a time. Each integrated circuit 401 has contact pads 411 and 410 for contacting the integrated optical detector 202. For testing of these integrated circuits, an integrated detector 202 is direct attached onto each integrated circuit 401, using the aforementioned direct attach process, prior to dicing of the wafer, to form an optical receiver on a chip 402. The wafer 420 (FIG. 4b) now contains a plurality of optical receivers on a chip 402. Using a testing apparatus 500 shown in FIG. 5, each of the optical receivers on a chip 402 is tested to determine its operating characteristics.

Figure 5:
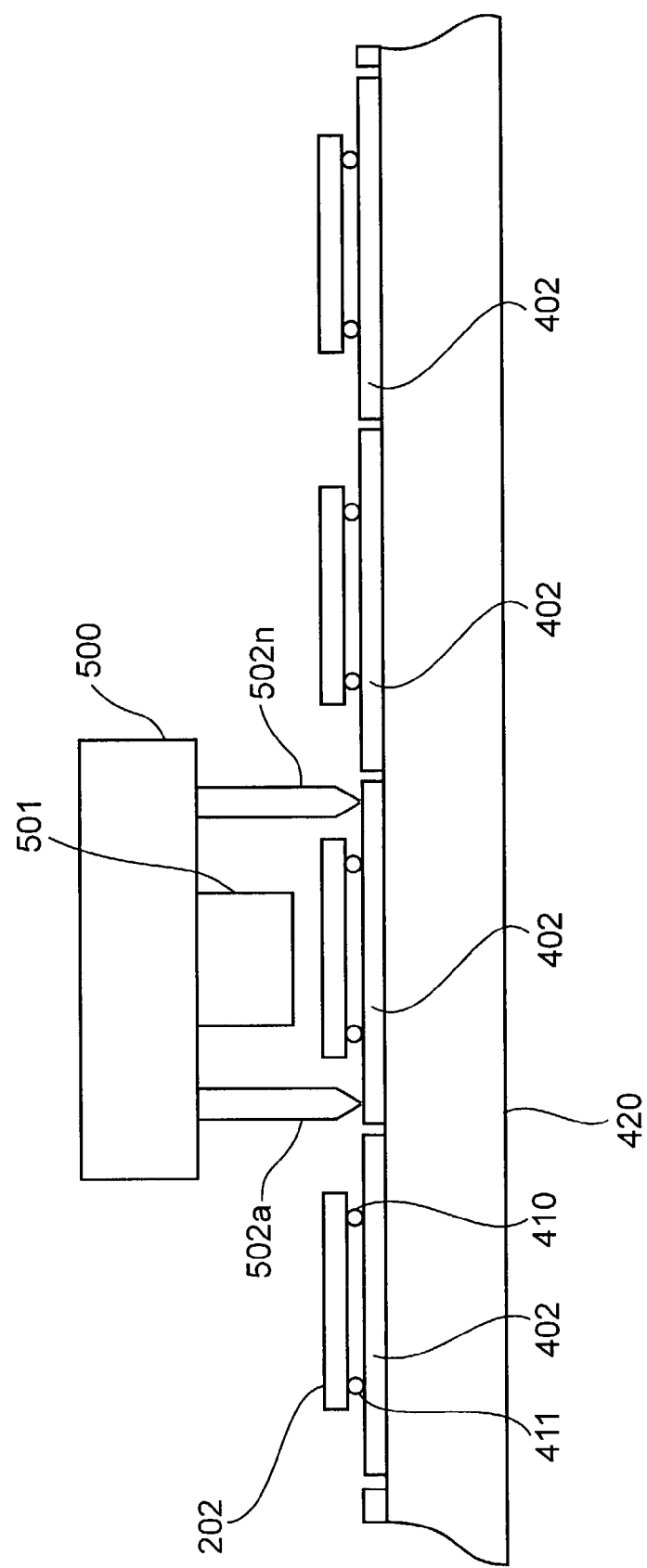
FIG. 5 illustrates a testing apparatus for testing of the plurality of optical receivers on a chip; and, FIG. 6 illustrates steps taken to test each of the plurality of optical receivers on a chip.
Figure 6:
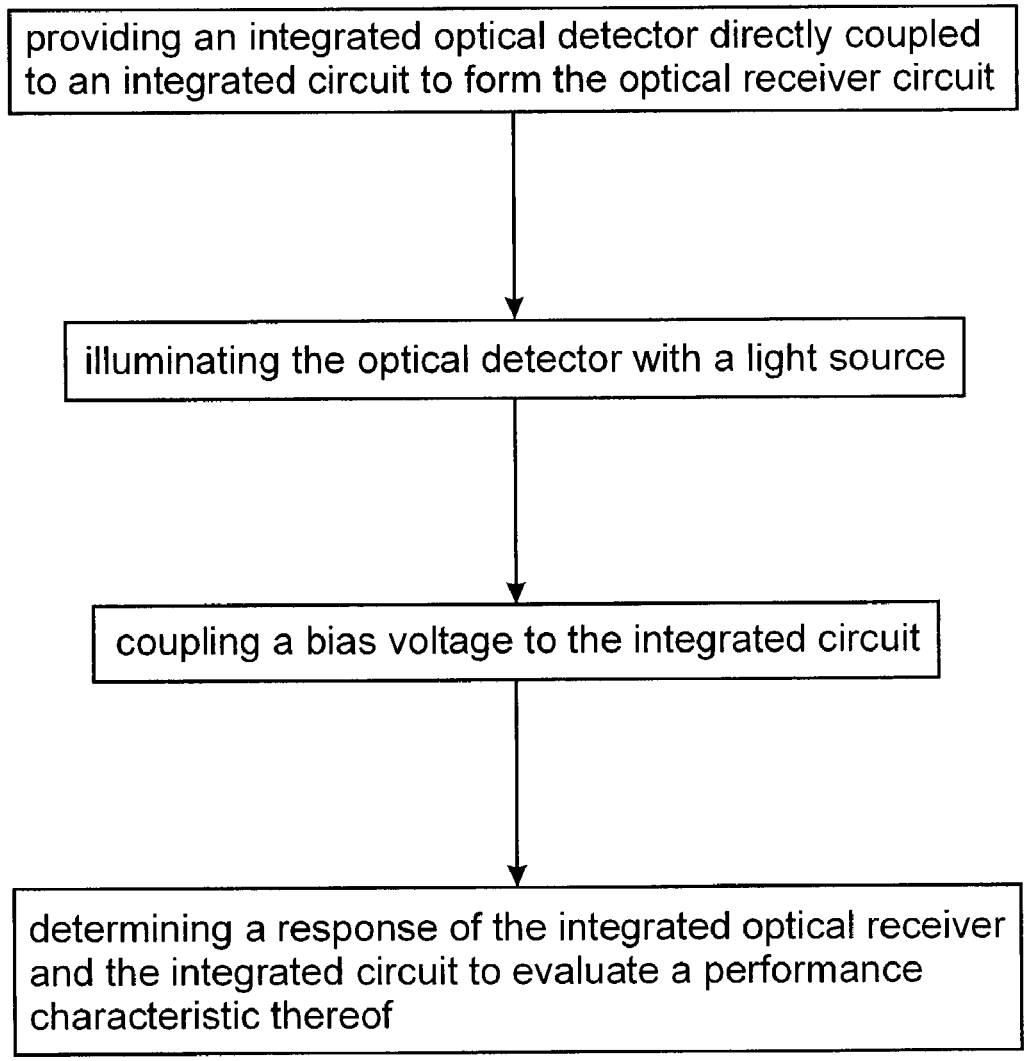

The testing apparatus 500, shown in FIG. 5, has a laser source 501, and a plurality of probes 502a through 502n. For testing purposes, the wafer 420 is placed in the testing apparatus and each optical receiver on a chip 402 is individually tested to determine its operating characteristics using steps shown in FIG. 6. Thus in testing, a light source in the form of a laser is aligned to each integrated optical detector portion of each optical receiver on a chip 402. Probes 502a through 502n contact input and output ports on the integrated circuit to provide bias voltage and to read an output signal therefrom, respectively. Of course, when testing of these devices, accurate alignment of the optical source 501 to the integrated receiver 202 is preferable. Testing on the wafer 420 advantageously allows for each optical receiver on a chip 402 to be individually tested using actual high-speed optical signals as if the device were being used as an actual receiver in a telecommunication system. This allows for high-speed performance of each optical receiver on a chip 402 to be characterized prior to dicing of the wafer 420 and prior to packaging of the diced optical receivers on a chip 402 into a housing. Optionally, tests such as integrated detector responsivity, or even sensitivity and overload are determinable using the testing apparatus 500. Testing prior to module assembly advantageously allows for yield to be determined at a wafer level and this significantly reduced future module assembly losses. If some of the plurality of optical receiver on a chip 402 do not meet predetermined criteria, they are not sold to the module customer nor assembled.

Figure 4C:
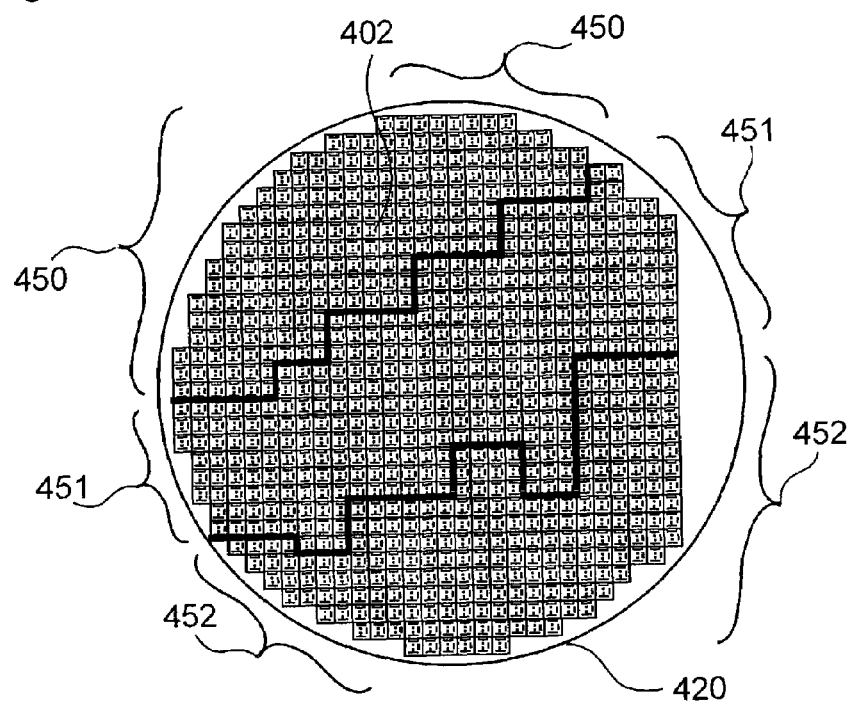
FIG. 4c illustrates a wafer after testing the plurality of optical receivers on a chip.

FIG. 4c illustrates a scenario where the wafer 420 has been tested and the plurality of optical receivers on a chip 402 have been grouped on the wafer 420 based on their performance in terms of the predetermined criteria. For instance, the optical receivers on a chip 402 that have a first performance characteristic within a range of performances are grouped in area 450, the optical receivers on a chip 402 that have second performance characteristic within a different range of performances are located in area 451 and those that have a third performance characteristic within another different range of performances are located in area 452. For commercial applications this allows for the manufacturers of these optical receivers on a chip 402 to "bin" the optical receivers into groups having known predetermined performance characteristics, thus advantageously allowing for determination of yield and quality prior to dicing of the wafer 420. If for some reason the process used to manufacture these optical receivers on a chip 402 is not adequate, then costs will be avoided because the wafer is scrapped prior to the expensive process of dicing and assembly. Moreover, partial wafer testing provides an early indication of total yield and allows one to determine if further testing is warranted. Thus, a yield loss is seen at the wafer level and not at the stage of integration into the module, advantageously saving manufacturers money and testing time. Once packaged into optical receiver modules, the performance characteristics are known so the components are binned appropriately. Thus, for end user, using the tested optical receiver module is much easier because critical receiver design parameters are assured through the device specifications, which are different for devices in different bins. This provides guaranteed optical performance of the optical receiver sold to the module manufacturer and commands a price premium over the individual components sold to the manufacturer under the prior art methods.

Moreover, price is typically established based on the performance characteristics of the devices allowing for enhanced profit margin for those components having a most advantageous performance characteristic.

Numerous other embodiments may be envisaged without departing from the spirit or scope of the invention.

What is claimed is:

1. An optical receiver comprising:
   an integrated optical detector having a first surface, the first surface having disposed a first detection region for providing a photocurrent in response to a received optical signal within a wavelength range of interest and a first output port electrically coupled to the detection region for providing photocurrent in response thereto, and a second surface disposed opposite the first surface for receiving the optical signal, the integrated optical detector formed within a first semiconductor material passing the optical signal within the wavelength of interest and,
   an integrated circuit formed of a second semiconductor material and having a first input port for receiving the photocurrent and a second input port for receiving a bias voltage and a second output port for providing an output signal, the first input port for direct coupling with the first output port absent a bond wire therebetween, and the integrated optical detector other than formed within the integrated circuit.

2. An optical receiver according to claim 1, wherein the direct coupling comprises direct mounting of the integrated optical detector on a surface of the integrated circuit.

3. An optical receiver according to claim 2, wherein the integrated optical detector is positioned substantially about a geometric center thereof.

4. An optical receiver according to claim 1, wherein the integrated circuit comprises an amplifier circuit, the amplifier circuit for receiving the photocurrent and for generating an amplified signal in dependence upon the received photocurrent and for providing this amplified signal at the second output port.

5. An optical receiver according to claim 4, wherein the amplifier circuit comprises circuitry for operating as a transimpedance amplifier.

6. An optical receiver according to claim 1, wherein the integrated circuit comprises a third output port proximate the second output port and a voltage amplifying circuit for providing an amplified voltage at the third output port, the integrated optical detector comprising an input port for coupling with the third output port.

7. An optical receiver according to claim 6, wherein the optical detector comprises an avalanche photodiode for being driven by the amplified voltage.

8. An optical receiver according to claim 1, wherein the integrated circuit comprises at least a de-coupling capacitor integrated on the semiconductor substrate.

9. An optical receiver according to claim 1, wherein the semiconductor substrate comprises silicon and germanium.

10. An optical receiver according to claim 1, wherein the integrated optical detector comprises other than silicon and germanium.

11. An optical receiver according to claim 1, wherein the integrated optical detector comprises indium and phosphorus.

12. An optical receiver according to claim 1, comprising:
    an optically opaque housing for substantially enclosing the optical receiver;
    a plurality of header pins penetrating the housing at least some of the plurality of header pins electrically isolated therefrom; and,
    an aperture disposed in the housing for providing light therethrough,
    the optical receiver having the integrated optical detector proximate the aperture and positioned for receiving the light.

13. An optical receiver according to claim 12, wherein the plurality of header pins comprises four (4) pins, each pair of the pins disposed about first and second substantially perpendicular axes.

14. An optical receiver according to claim 13, wherein the semiconductor substrate is oriented such that each side of the semiconductor substrate is other than parallel to a line formed between a header pin and a closest adjacent header pin.

15. An optical receiver according to claim 13, comprising a lens mounted within the aperture, the lens for focusing the light onto the integrated optical detector.

16. A method of testing an optical receiver circuit residing on a semiconductor wafer comprising the steps of:
    (a) providing an integrated circuit formed of a first semiconductor material; the integrated circuit having at least a first input port for receiving a photocurrent signal;
    (b) providing an integrated optical detector directly coupled to the integrated circuit to form an optical receiver circuit, the integrated optical detector formed of a second semiconductor material, comprising a first surface having a first detection region for providing a photocurrent in response to a received optical signal within a wavelength range of interest, a first output port electrically coupled to the detection region for receiving the photocurrent and the first input port of the integrated circuit, and a second surface disposed opposite the first surface for receiving the optical signal, the integrated optical detector formed within a second semiconductor material passing the optical signal within the wavelength range of interest;

(c) illuminating a predetermined region of the second surface of the integrated optical detector with a light source, the light source having at least a predetermined intensity and a predetermined wavelength, the predetermined wavelength within the wavelength range of interest;

(d) coupling a predetermined bias voltage to the integrated circuit; and, (e) determining a response of the integrated optical receiver and the integrated circuit to evaluate a performance characteristic thereof.

17. A method of testing according to claim 16, wherein the integrated circuit remain part of the semiconductor wafer throughout execution of steps (a) to (e).

18. A method of testing according to claim 17, comprising the step of:
binning the optical receiver circuit in accordance to the performance characteristics thereof.

19. A method of testing according to claim 18, wherein the performance characteristics are at least one of responsivity and sensitivity and overload.

20. A method of testing according to claim 16, wherein a performance characteristic is at least one of responsivity, wavelength variation in responsivity, electrical noise, and minimum optical power for specific bit-error rate at a predetermined datarate.

21. A method of testing according to claim 16, wherein the light source is modulated.

22. A method of testing according to claim 16, wherein the integrated optical detector is disposed on the integrated circuit using a direct attach process.

23. A method of testing according to claim 16, wherein if the performance characteristic of the optical receiver circuit is below a certain level the optical receiver circuit is indicated as failed.

24. A method of testing according to claim 16, wherein the step of illuminating comprises the step of aligning the light source to the integrated optical detector.

25. A method of testing according to claim 16, comprising the steps of:
segmenting the semiconductor wafer to provide individual optical receiver circuits; and,
assembling of the individual optical receiver circuits in a housing.

26. A method of testing according to claim 16, wherein the step of illuminating uses a high speed modulated optical signal and wherein the step of determining a response of the integrated optical circuit comprises a step of detecting of the high speed modulated optical signal to determine at least one of a bit error rate and other characteristic thereof.

27. An optical receiver comprising:
an optically opaque housing for substantially enclosing the optical receiver;
an integrated optical detector disposed within the housing and having a first surface, the first surface having disposed a first detection region for providing a photocurrent in response to a received optical signal within a wavelength range of interest and a first output port electrically coupled to the detection region for providing photocurrent thereto, and a second surface disposed opposite the first surface for receiving the optical signal, the integrated optical detector formed within a first semiconductor material passing the optical signal within the wavelength of interest and,
an integrated circuit disposed within the housing and formed of a second semiconductor material in a second semiconductor substrate and having a first input port for receiving the photocurrent and a second input port for receiving a bias voltage and a second output port for providing an output signal, the first input port for coupling with the first output port using a bond wire having predetermined impedance and a predetermined spatial orientation therebetween, the first semiconductor substrate and the second semiconductor substrate being other than the same substrates.

28. An optical receiver according to claim 27, comprising:
a substrate within the housing, wherein the optical detector is bonded directly to the substrate and the
integrated circuit is bonded directly to the substrate.

29. An optical receiver according to claim 27, comprising:
a substrate wherein the optical detector is bonded
directly to the substrate and the integrated circuit is integrated within the substrate.

30. An optical receiver according to claim 27, wherein the integrated circuit comprises an amplifier circuit, the amplifier circuit for receiving the photocurrent and for generating an amplified signal in dependence upon the received photocurrent and for providing this amplified signal at the second output port.

31. An optical receiver according to claim 30, wherein the amplifier circuit comprises circuitry for operating as a transimpedance amplifier.

32. An optical receiver according to claim 27, wherein the integrated circuit comprises a third output port proximate the second output port and a voltage amplifying circuit for providing an amplified voltage at the third output port, the integrated optical detector comprising a third input port for coupling with the third output port.

33. An optical receiver according to claim 32, wherein the optical detector comprises an avalanche photodiode for being driven by the amplified voltage.

34. An optical receiver according to claim 27, wherein the integrated circuit comprises at least a de-coupling capacitor integrated on the second semiconductor substrate.

35. An optical receiver according to claim 27, wherein the optically opaque housing comprises:
a plurality of header pins penetrating the housing at least some of the plurality of header pins electrically isolated therefrom; and,
an aperture disposed in the housing for providing light therethrough,
the optical receiver having the integrated optical detector proximate the aperture and positioned for receiving the light.

36. An optical receiver according to claim 35, wherein the plurality of header pins comprises four (4) pins, each pair of the pins disposed about first and second substantially perpendicular axes.

37. An optical receiver according to claim 36, wherein the semiconductor substrate is oriented such that each side of the second semiconductor substrate is other than parallel to a line formed between a header pin and a closest adjacent header pin.

38. An optical receiver according to claim 36, comprising a lens mounted within the aperture, the lens for focusing the light onto the integrated optical detector.

* * * * *